(12) United States Patent
Jiten et al.

(10) Patent No.: US 6,767,221 B2
(45) Date of Patent: Jul. 27, 2004

(54) IC SOCKET MODULE

(75) Inventors: Hirotaka Jiten, Osaka (JP); Michiya Kusaka, Osaka (JP)

(73) Assignee: Espec Corp., Osaka (JP)

( * ) Notice: Subject to any disclaimer, the term of this patent is extended or adjusted under 35 U.S.C. 154(b) by 0 days.

(21) Appl. No.: 10/224,365

(22) Filed: Aug. 21, 2002

(65) Prior Publication Data

US 2003/0153199 A1 Aug. 14, 2003

(30) Foreign Application Priority Data

Feb. 14, 2002 (JP) ........................................ 2002-037441

(51) Int. Cl.[7] ............................................. H01R 12/00
(52) U.S. Cl. ........................... 439/68; 439/70; 439/331; 439/581; 439/755
(58) Field of Search ............................ 439/68, 62, 331, 439/70, 71, 72, 581, 755; 324/755

(56) References Cited

U.S. PATENT DOCUMENTS 5,460,538 A * 10/1995 Ikeya ........................ 439/331
6,078,185 A * 6/2000 Tanaka et al. ............... 324/755
6,152,744 A * 11/2000 Maeda ......................... 439/71
6,313,653 B1 * 11/2001 Takahashi et al. ........... 324/760
6,498,299 B2 * 12/2002 Sekizuka .................. 174/75 C

FOREIGN PATENT DOCUMENTS

JP 07-083996/1995 3/1995
JP 08-220187/1996 8/1996

* cited by examiner

Primary Examiner—Truc Nguyen
(74) Attorney, Agent, or Firm—Nixon & Vanderhye, PC.; Frank P. Presta

(57) ABSTRACT

In order to carry out the electric property evaluation of internal wiring of an IC, the IC is attached to an IC socket, and terminals of the IC socket are connected with the external wiring via leads and coaxial connectors. The IC is directly in touch with a heating plate, for making the IC have a high temperature. The IC socket is provided with protrusions thereon, for forming a gap between the IC socket and the IC. On this account, it is possible to acquire an IC socket module in which the temperature of the IC is kept consistent when the evaluation of the internal wiring and wiring members of the IC is carried out at a high temperature.

26 Claims, 13 Drawing Sheets

IN THE IDEAL SITUATION
$$I = \frac{V}{R}$$

IN REALITY
$$I = \frac{V}{R} + \frac{V}{R1+R2}$$

IN THE CASE OF USING A GUARD
$$I = \frac{V}{R}$$

IC SOCKET MODULE

FIELD OF THE INVENTION

The present invention relates to an IC socket module for attaching an IC to an IC socket so as to connect terminals of the IC socket with the external wiring via leads, in order to carry out the electric property evaluation of the internal wiring of the IC at a high temperature.

BACKGROUND OF THE INVENTION

As illustrated in FIG. 10, the internal wiring and wiring members of an IC (Integrated Circuit) 100 has conventionally been evaluated by carrying out voltage source current measurement or current source voltage measurement with respect to the IC 100 packaged in an IC socket 101.

In these measurement, a heat test is carried out in addition to the check of the initial condition at normal temperatures. In the heat test, the IC 100 is measured at a high temperature, in order to accelerate the degradation of the electric property thereof.

The conventional test at a high temperature is carried out inside a high-temperature thermostatic oven, as illustrated in FIGS. 11 through 13. To figure out the life and electric property of each IC 100 using a statistical method, the number of sample ICs is usually around 10–20.

When carrying out the test, as FIG. 11 shows, a plurality of ICs 100 connected with the corresponding IC sockets 101 are provided on openings (not illustrated) of respective stainless plates 102. Then, as also illustrated in FIG. 12, each of the IC sockets 101 is connected with an extension substrate 104, provided on a surface in a lengthwise direction of the stainless plate 102; the surface and the stainless plate 102 are arranged so as to form a common surface, via a coaxial cable 103 provided on the reverse side of the respective stainless plates 102. The extension substrates 104 protrude from a thermostatic oven 105. Therefore, by connecting a card edge connector 106 with the edge of the respective extension substrates 104, it is possible to acquire signals from the internal wiring and wiring members of the respective ICs 100 using an external measuring circuit (not illustrated), via wires connected to the respective card edge connectors 106.

The aforementioned sample ICs are, as illustrated in FIGS. 11 and 12, provided side by side in the thermostatic oven 105, without touching each other. As shown in FIG. 13, the sample ICs are exposed to a high temperature using a heater 107 of the thermostatic oven 105, and at this moment, a blower 109 driven by a blower motor 108 circulates air inside the thermostatic oven 105.

Incidentally, in this test, the lives (electric property) of the samples considerably vary in accordance with the Arrhenius equation when the temperature of the samples changes, so that it is important to keep the temperature of the samples consistent.

In this regard, in the conventional method, the temperature of the thermostatic oven 105 tends to be different between sample ICs provided in different parts of the thermostatic oven 105, so that the test data is considerably erratic. Thus it has been difficult to acquire accurate test results.

So, to keep the temperature of the sample ICs consistent, for instance, there is a sample heating method disclosed by Japanese Laid-Open Patent Application No. 8-220187/1996 (Tokukaihei 8-220187; published on Aug. 30, 1996).

As illustrated in FIG. 14, this sample heating method is arranged such that samples 203 are provided on a heating block 202 in a testing room 201 which is covered with a heat insulating material, and the samples 203 are directly heated at a high temperature. In this procedure, pins 204 of the respective samples 203 are inserted into pin holes 206 of a sample attaching substrate 205, and the sample attaching substrate 205 is screwed on the heating block 202 by a screw 207, etc. On this account, the electric property of the samples 203 can be accurately measured without the difference of the temperatures, according to this invention.

However, in the conventional evaluation system using the heating block, since a large amount of heat is dissipated from the sample attaching substrate 205 (i.e. from the IC sockets 101) via the samples 203, the variation of heat resistance due to this heat dissipation greatly degrades the temperature distribution of the samples.

One of the reasons of this degradation of the temperature distribution is the increase of an evaluation temperature. The evaluation temperature of 350° C. is now required for the currently-used copper wiring in the IC 100 in the state of electro-migration, while in the past the evaluation temperature for aluminum wiring was 250° C. at the maximum.

Moreover, owing to the miniaturization of wiring in the semiconductor device, the measuring current is getting smaller so that units of fA (femtoampere=$10^{-15}$A) have currently been used for the measurement. To measure such a minute current, it is necessary to reduce the disturbance noise affecting the measuring system as much as possible. However, a high-insulating material conventionally used for the shielding arrangement for reducing the disturbance noise, such as Teflon (registered trademark), etc., is not usable at a high temperature of 350° C.

SUMMARY OF THE INVENTION

The objective of the present invention is to provide an IC socket module in which the temperature of an IC is kept consistent when the evaluation of the internal wiring and wiring members of the IC is carried out at a high temperature.

To achieve the objective above, for carrying out electric property evaluation of internal wiring of the IC at a high temperature, the IC socket module in accordance with the present invention includes: an IC socket to which the IC is attached; protrusions, which are provided on the IC socket, for forming a gap between the IC socket and the IC; terminals which are attached to the IC socket; leads which are connected with the respective terminals; and coaxial connectors which are connected with (i) the respective leads and (ii) external wiring, the IC attached to the IC socket being directly in touch with a heating member so as to make the IC have a high temperature.

According to this invention, since the IC socket is provided with the protrusions for forming the gap between the IC socket and the IC, the IC is in touch with the IC socket only at the protrusions. Thus when the IC is heated by the heating member, the thermal conduction from the IC to the IC socket is small.

Consequently, it is possible to provide the IC socket module in which the temperature of the IC is kept consistent when the evaluation of the internal wiring and wiring members of the IC is carried out at a high temperature.

For a fuller understanding of the nature and advantages of the invention, reference should be made to the ensuing detailed description taken in conjunction with the accompanying drawings.

DESCRIPTION OF THE EMBODIMENTS

The following description will discuss an embodiment in accordance with the present invention in reference to FIGS. 1 through 9.

An IC socket module in accordance with the present embodiment carries out voltage source current measurement or current source voltage measurement, as the evaluation of the internal wiring and wiring members of an IC (Integrated Circuit) packaged in an IC socket. The arrangement of the IC packaged in the IC socket is generally termed a TEG (Test Element Group).

In the evaluation above, a heat test is carried out in addition to the check of the initial condition at normal temperatures. In the heat test, the measurement is carried out at a high temperature, in order to accelerate the degradation characteristics. The IC socket module in accordance with the present embodiment is arranged so as to be suitable for the measurement at a high temperature.

Figure 1:
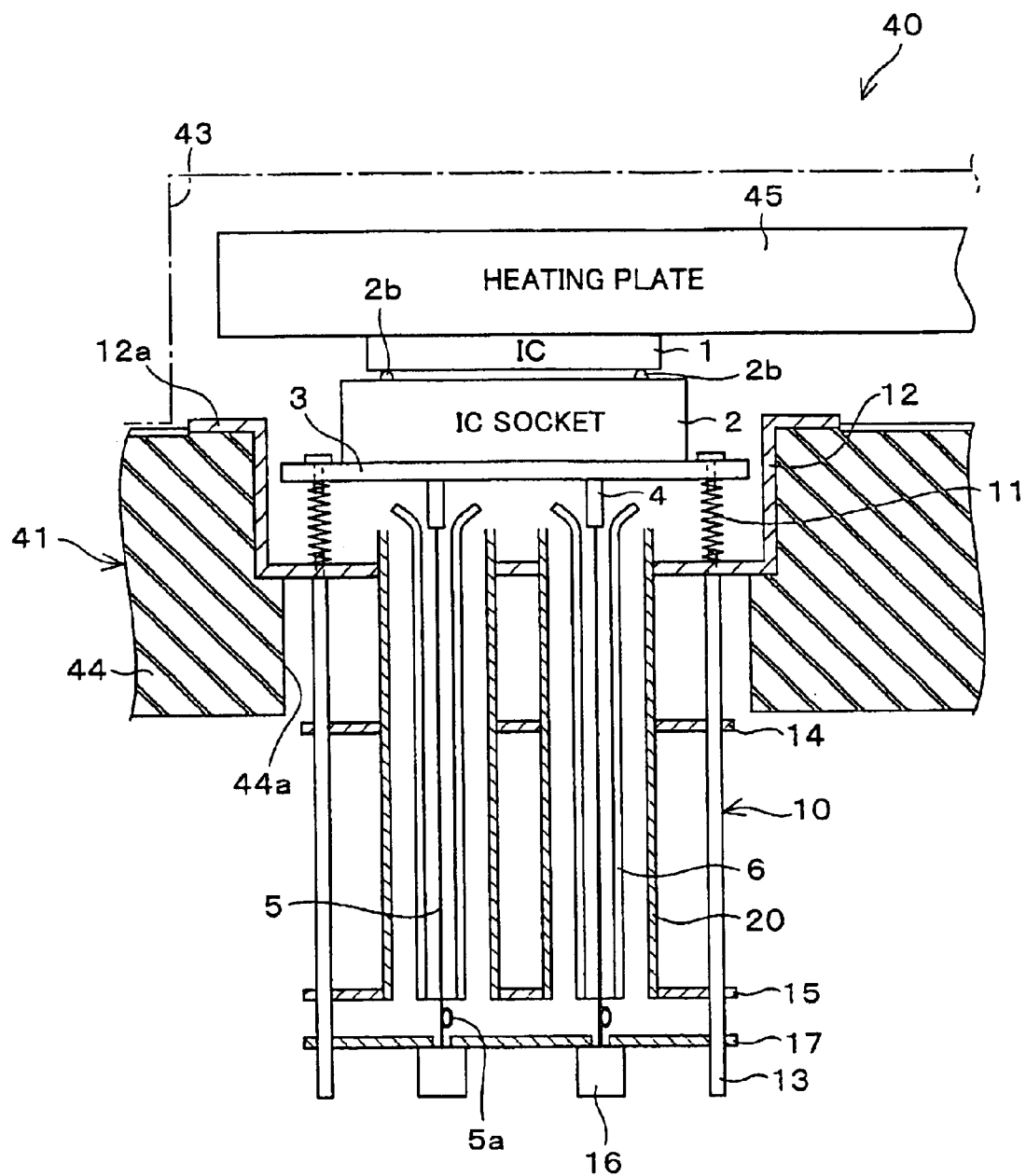
FIG. 1 is a schematic cross section, illustrating an embodiment of an IC socket module in accordance with the present invention.

As illustrated in FIG. 1, the IC socket module is provided with an IC socket 2 to which an IC 1 is attached. This IC socket 2 is made of ceramic and provided with a socket attachment 3 on the bottom surface thereof.

As illustrated in FIGS. 2(a) and 2(b), the IC socket 2 has a plurality of pin holes 2a, which penetrate the IC socket 2, into which a plurality of corresponding pins 1a are inserted from the top surface of the IC socket 2. In contrast, the bottom surface of the IC socket 2 is provided with terminals 4 which are terminals electrically connected with the corresponding pin holes 2a. Incidentally, the socket attachment 3 is electrically insulated from the terminals 4.

Some of the terminals 4 are connected with leads 5, and these leads 5 are, for instance, made of nickel. However, the leads 5 are not necessarily made of this and hence may be made of copper. The leads 5 are connected with the terminals 4 by, for instance, carrying out silver-allot blazing after the compress-bonding of the pins.

In the present embodiment, the upper side, i.e. the side close to the IC socket 2, of each of the leads 5 is coaxially covered with an insulating tube 6 which is a thermal-insulating tube made of glass. That is to say, for instance, the insulating tube 6, which is an electrically as well as thermally insulating tube made of glass, is not only a thermally insulating body resistant to at least a temperature of 350° C. but also an electrically insulating body. Although the insulating tube 6 is made of glass in the present embodiment, the material of the insulating tube 6 is not limited to this so that the tube 6 may be made of, for instance, ceramic as long as the material is resistant to at least a temperature of 350° C.

In the present embodiment, the edge of the insulating tube 6 made of glass, the edge closer to the terminal 4, is formed so as to be funnel-shaped, as illustrated in FIG. 1. On this account, it is possible to avoid the damage of the lead 5, which is caused when the lead 5 touches the end face of the insulating tube 6.

Moreover, as FIG. 2(b) shows, at the outside of the edge of the insulating tube 6, the lead 5 is connected with a corresponding Teflon-covered wire 8, which is covered with Teflon (registered trademark), via solder 7. The other edge of the Teflon-covered wire 8 extends downward. The Teflon-covered wire 8 is not necessarily covered with this material so that, for instance, the insulating tube 6 made of glass may cover the lead and wire from top to bottom, as illustrated in the schematic view of FIG. 1.

Figure 3:
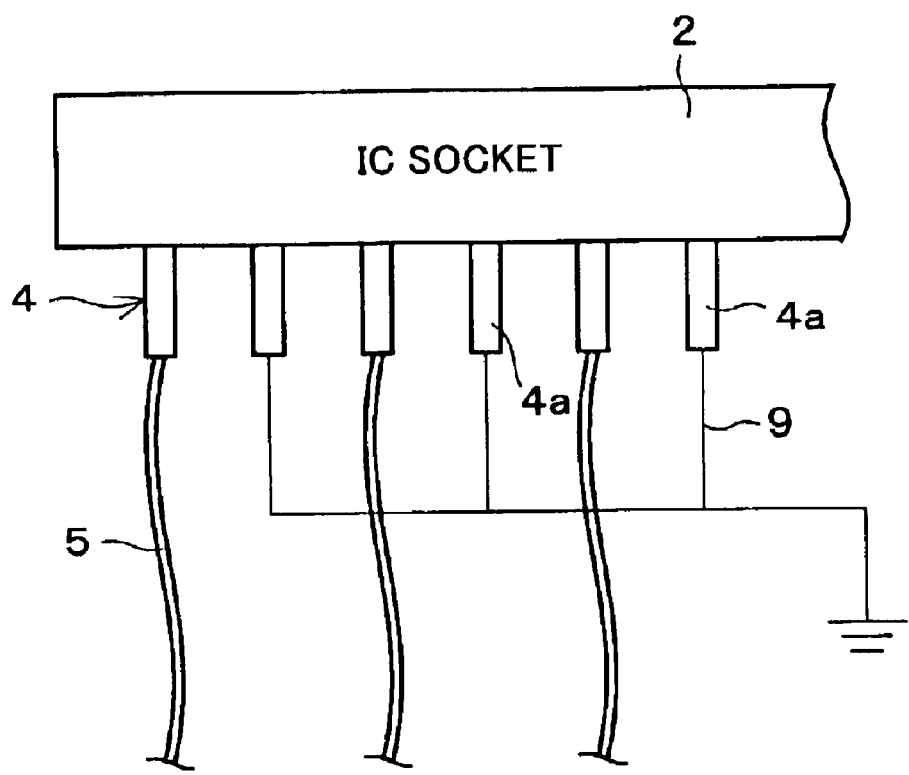
FIG. 3 is a schematic view, illustrating non-connecting terminals and grounding wires of the IC socket module.

In contrast, among the plurality of terminals 4 of the IC socket 2, non-connecting terminals 4a to which the leads 5 are not connected are serially jumper-connected with a grounding wire 9 made of, for instance, nickel, and the edge of the grounding wire 9 is grounded as illustrated in FIG. 3.

As illustrated in FIG. 1, the IC socket 2 with which the leads 5 are connected is attached to a socket supporting member 10. This socket supporting member 10 is provided with: a socket cover 12 which is shaped like a rectangular box and provided for attaching the IC socket 2 in a floating manner by springs 11; four columns 13 vertically descending from corresponding four corners of the bottom surface of the socket cover 12; tube supporting plates 14 and 15 each composed of a plate supporting not only the columns 13 but also copper tubes 20 which are described later; and a connector mounting plate 17 on which coaxial connectors 16 are mounted.

The socket cover 12 is capable of (i) being inserted into a hole 44a penetrating a heat-resistant wall 44 of a sample heating device 40, and (ii) being fixed to the heat-resistant wall 44 by collar sections 12a formed at the top ends of the socket cover 12.

Figure 4:
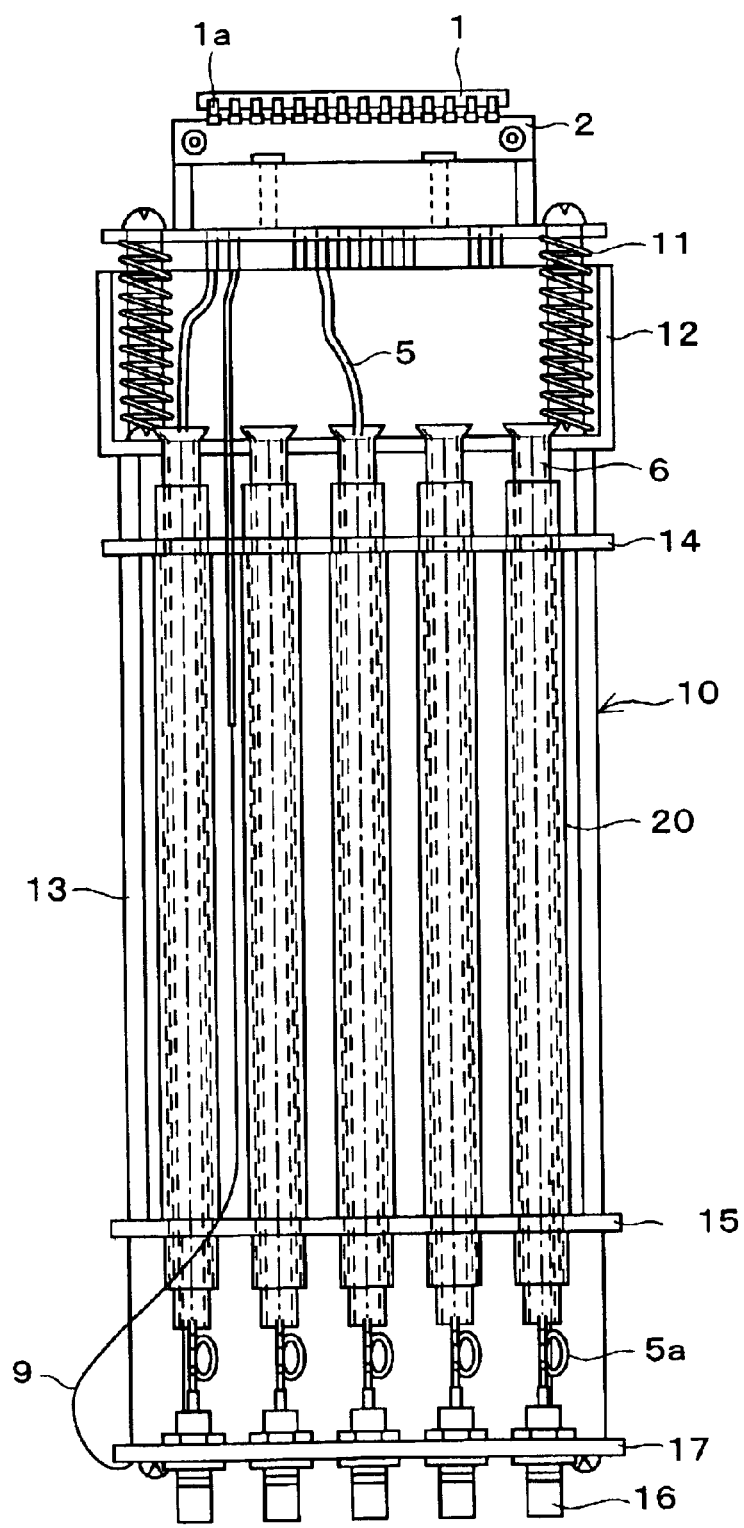
FIG. 4 is a front view, illustrating an arrangement of the IC socket module.
Figure 5:
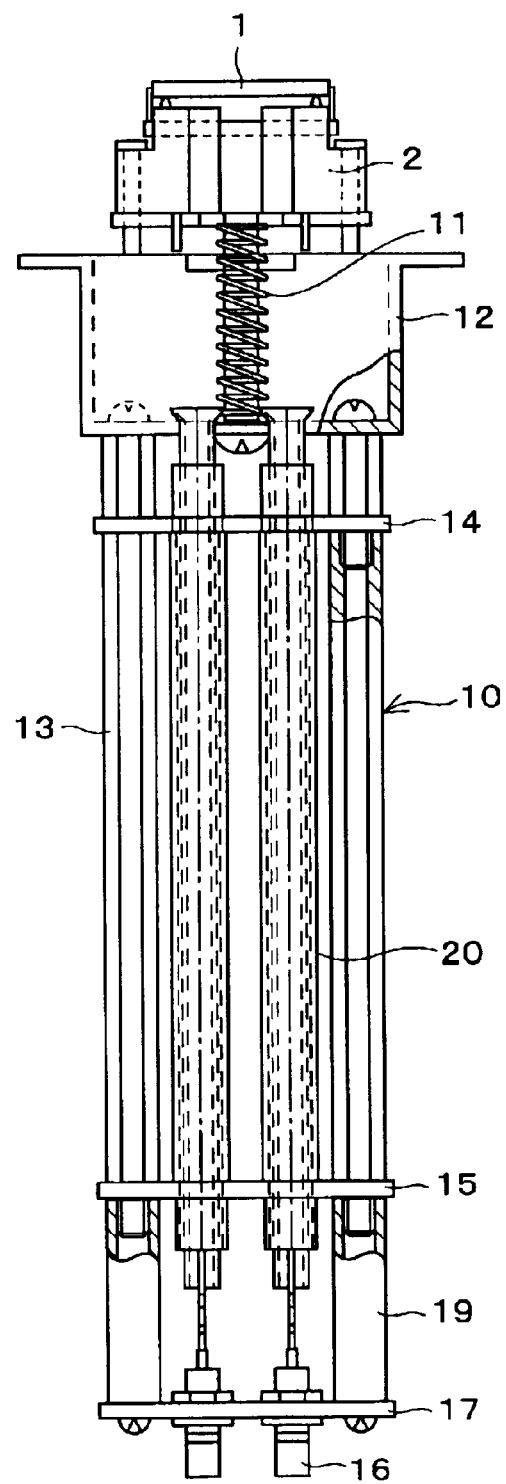
FIG. 5 is a side view, illustrating the arrangement of the IC socket module.
Figure 6:
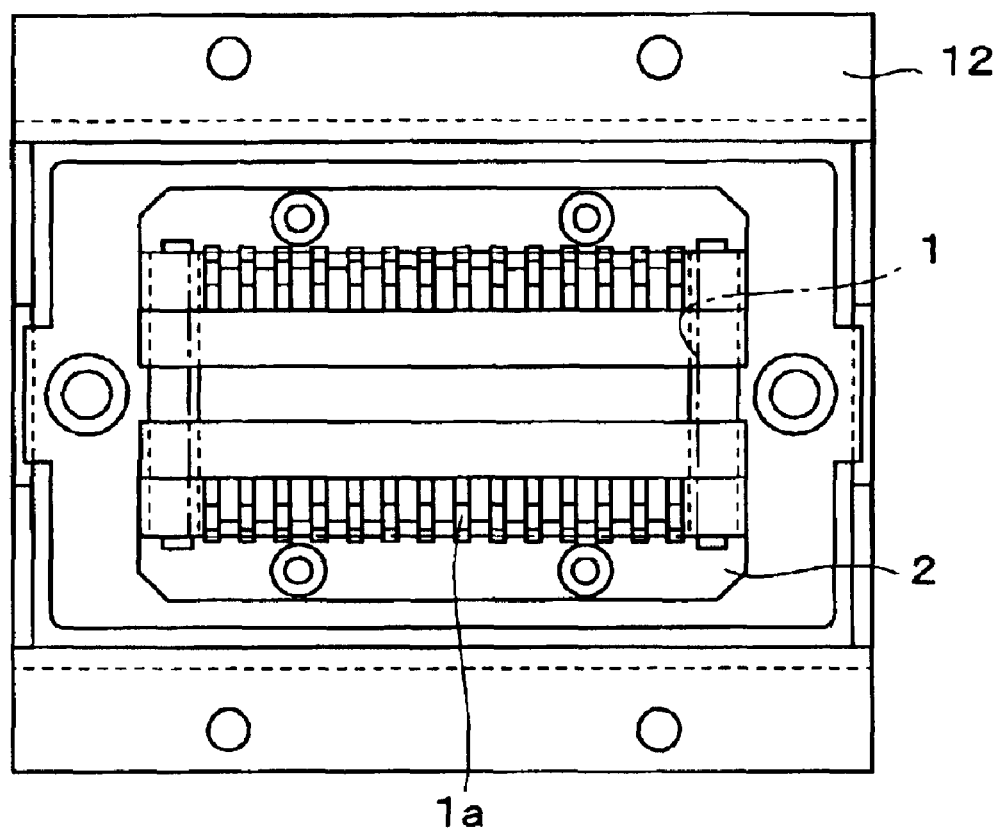
FIG. 6 is a plan view, illustrating the arrangement of the IC socket module.

In contrast, as FIGS. 4 through 6 illustrate, the copper tubes 20, which are metal tubes, are coaxially provided outside of the corresponding insulating tubes 6 covering the corresponding leads 5. The top edge of each of the copper tubes 20 almost reaches the terminal 4 of the IC socket 2.

However, the copper tubes 20 are supported so as to be in isolation from the IC socket 2, in order to be thermally isolated from the high temperature from the heating plate 45. That is to say, the edge of each of the copper tubes 20 neither touch the IC socket 2 nor is supported by the socket cover 12. On this account, the heat from the IC socket 2 is hardly conducted to the copper tubes 20. Incidentally, although the copper tubes 20 are not supported by the socket cover 12 in the figure, the arrangement is not limited to this so that, as illustrated in the schematic view of FIG. 1, the copper tubes 20 may be supported by the socket cover 12. In this case, the springs 11 are provided between the IC socket 2 and the socket cover 12, and hence the heat is hardly conducted to each other.

Moreover, each of the tube supporting plates 14 and 15 supporting the copper tubes 20 is composed of a metal which is a heat-insulating member for the thermal insulation from a high temperature.

The springs 11 provided in the socket cover 12 function as elastic members for opposing the pressure exerted due to the movement of a heating plate 45, which is a heating member described later, touching the IC 1.

Furthermore, the grounding wire 9, composed of nickel wires connected to the corresponding non-connecting terminals 4a of the IC socket 2, is partly Teflon-covered. The edge of this Teflon-covered wire is, as illustrated in FIG. 4, connected with the connector mounting plate 17 via the pressure terminal and by solder. On this account, the grounding wire 9 is connected with an externally-provided measuring apparatus (not illustrated), via the connector mounting plate 17, the coaxial connectors 16, and the coverings of the respective coaxial connectors 16, so as to be grounded.

Also, as FIG. 4 illustrates, the present embodiment is arranged such that each of the leads 5 is provided with a ring section 5a at the outside of the edge of the insulating tube 6 made of glass, and connected with the corresponding coaxial connector 16 on the side of the external wiring. Thus, when the IC 1 is pressed by the heating plate 45 so that the IC socket 2 descends due to the springs 11, the descending movement is buffered thanks to the elasticity of the ring sections 5a. Consequently, thanks to this buffer arrangement, the leads 5 provided between the IC socket 2 arranged in the floating manner and the coaxial connectors 16 are not damaged. Moreover, the pressing and attaching of the heating plate 45 on the IC 1 are properly carried out.

Figure 7:
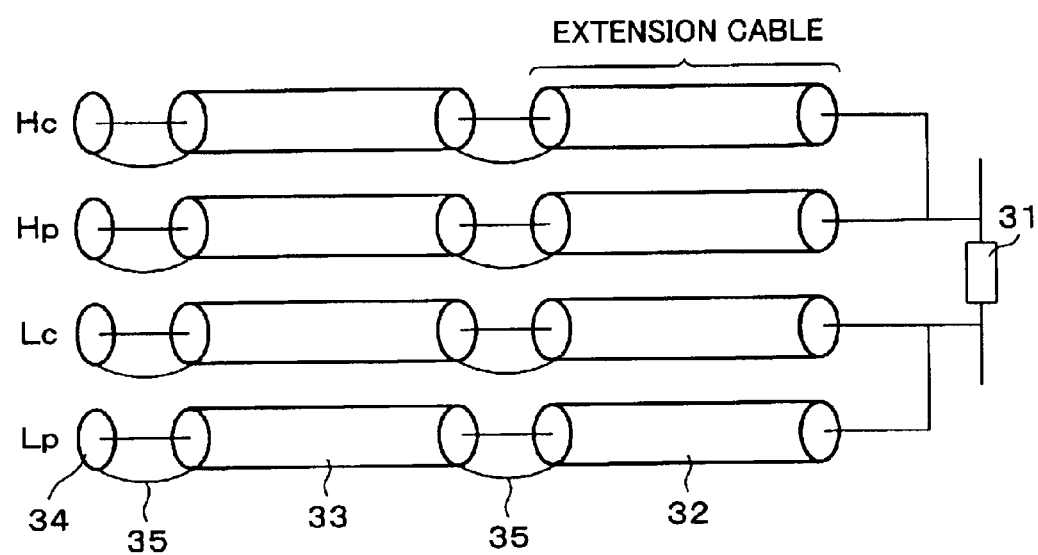
FIG. 7 is a schematic view, illustrating a 4-terminal-pair method.

As described above, in the present embodiment, the lead 5 is not shielded at the portion between the copper tube 20 and the coaxial connector 16 due to the existence of the ring section 5a. When the impedance inside the IC 1 is measured by a highly precise 4-terminal-pair method, it is necessary to electromagnetically shield the leads 5 and the extensions thereof all the way to the measuring circuit. Thus, in this case, it is required to electrically connect the copper tubes 20 with the coverings of the coaxial connectors 16. That is to say, when the measurement of low impedance by the 4-terminal-pair method is carried out, as illustrated in FIG. 7, it is necessary to measure: a current Hc of the plus side signal; a voltage Hp of the plus side signal; a current Lc of the minus side signal; and a voltage Lp of the minus side signal, with respect to a measuring object 31. At this moment, if shield conductors 32, 33, and 34, of respective measuring cables of the 4-terminal-pair arrangement, are discontinued, as the figure indicates, it is necessary to connect these shield conductors by means of, for instance, wires 35, etc.

In the present embodiment, as illustrated in FIG. 5, columns 19, which connect the tube supporting plate 15 for supporting the copper tubes 20 with the connector mounting plate 17, are made of metal, so that the copper tubes 20 are connected with the coverings of the coaxial connectors 16, via the tube supporting plate 15, the columns 19, and the connector mounting plate 17. As a result, since the copper tubes 20 are connected with the coverings of the coaxial connectors 16, it is possible to carry out the measurement by the 4-terminal-pair method in the present embodiment.

In contrast, when carrying out the electric property evaluation of the internal wiring of the IC 1 at a high temperature in the IC socket module, conventionally the heating plate 45 is applied directly to the IC 1 as an attempt to keep a predetermined high temperature. However, according to this method, the IC 1 closely contacts with the IC socket 2 so that the IC socket 2 functions as a heat sink, and hence the temperature of the IC 1 is lowered and this makes it difficult to keep the temperature consistent.

Thus, as illustrated in FIG. 1, the present embodiment is arranged such that the IC socket 2 is provided with protrusions 2b for forming a gap between the IC socket 2 and the IC 1. The number of the protrusions 2b is, for instance, 4. Each of these protrusions 2b is, for instance, roundheaded, and hence the damage of the IC 1 is prevented, and the contact surface against the IC 1 is reduced so that the thermal diffusion is prevented. In the present embodiment, the height of the protrusion 2b is, for instance, around 1–2 mm.

Now, taking the IC socket module having the aforementioned arrangement as an instance, a heating device for carrying out the electric property evaluation of the internal wiring of the IC 1 at a high temperature will be described.

Figure 8:
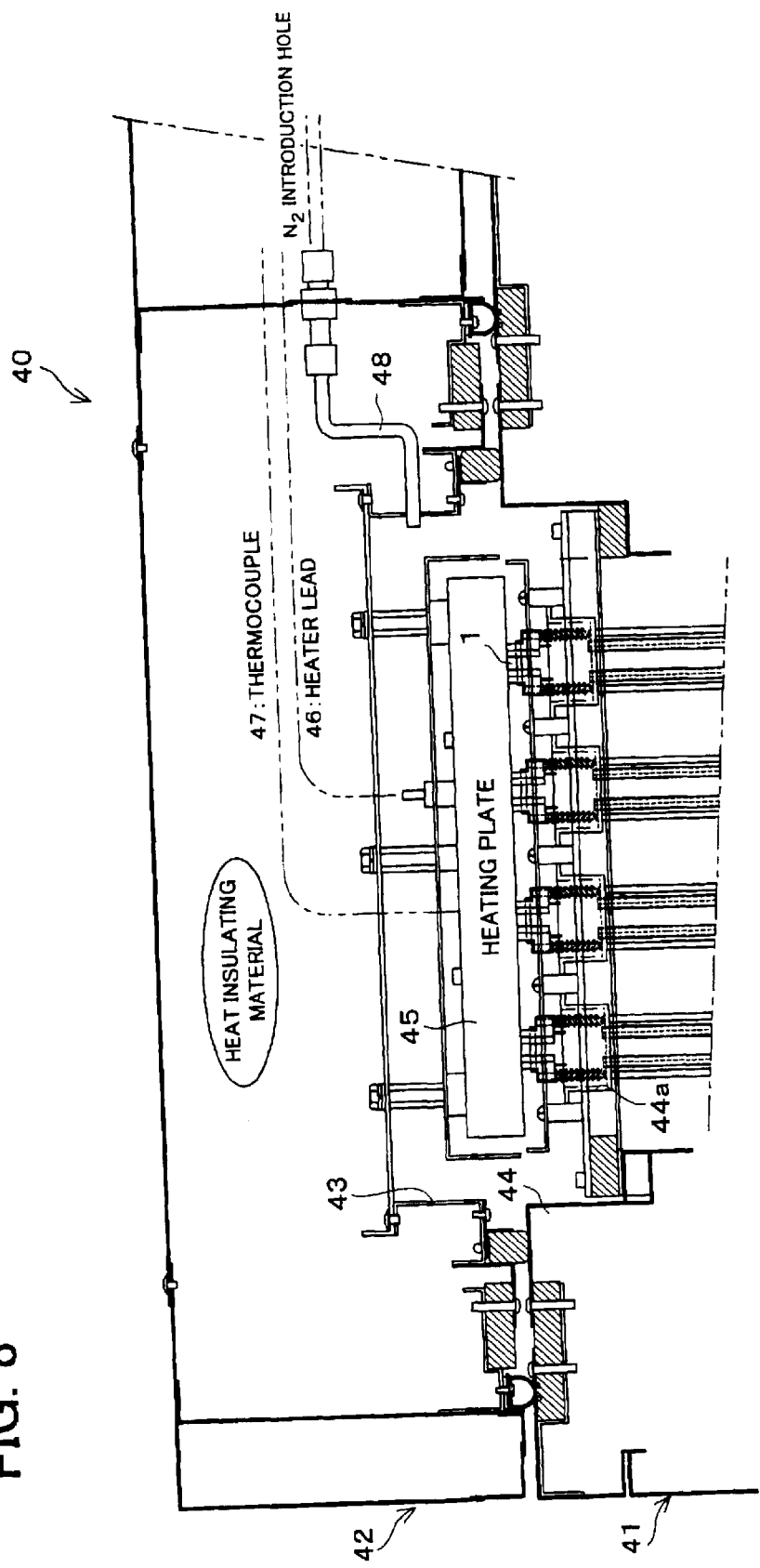
FIG. 8 is a cross section, illustrating an arrangement of a sample heating device.

The sample heating device 40 in accordance with the present embodiment is, as illustrated in FIG. 8, roughly composed of a sample keeping section 41 and a lid section 42 which can be opened/closed, and between the sample keeping section 41 and the lid section 42, a cavity section 43 is formed. The sample keeping section 41 and the lid section 42 are made of a heat-insulating material.

As illustrated in FIG. 1, the sample keeping section 41 is arranged so that a plurality of holes 44a penetrate through a heat-insulating wall 44, and a plurality of IC socket modules can be inserted into the respective holes 44a, with the heights of the modules kept consistent. By the way, the bottom surface of the IC socket module in the corresponding sample keeping section 41 is exposed so as to be kept at normal temperatures.

In the meantime, on the bottom surface of the lid section 42, the heating plate 45, which is a flat plate, is provided, and this heating plate 45 is heated by a power source (not illustrated) via a heater lead 46, so that the temperature of the heating plate 45 is raised, for instance, to be 350° C. or more.

This heating plate 45 is also provided with a thermocouple 47 for measuring the temperature of the heating plate 45. Moreover, in the present embodiment, a gas pipe 48 for introducing, for instance, nitrogen gas into the cavity section 43 is provided.

The followings are descriptions of the operation of carrying out the electric property evaluation of the internal wiring of the IC 1 at a high temperature, using the IC socket module and the sample heating device 40 arranged as above.

For carrying out the evaluation, first of all, the IC 1 to be evaluated is attached to the IC socket 2 of the IC socket module, as illustrated in FIG. 4. In this procedure, the pins 1a of the IC 1 are inserted into the respective pin holes 2a until the IC 1 touches the protrusions 2b of the IC socket 2.

Then the lid section 42 of the sample heating device 40, which is illustrated in FIG. 8, is opened, and as FIG. 1 shows, the IC socket module to which the IC 1 is attached is inserted into the corresponding hole 44a of the heat-insulating wall 44. Subsequently, the coaxial connectors 16 provided on the bottom of the IC socket module are connected to the wires from the measuring circuit (not illustrated).

Then, as illustrated in the same figure, the lid section 42 is closed so that the heating plate 45 is pressed on the IC 1. Since the IC socket 2 is provided with the springs 11 as shown in FIG. 1, the IC socket 2 opposes the pressure from the heating plate 45 so as to press the IC 1. On this account, the heating plate 45 effectively contacts with the IC 1 due to the springs 11. Incidentally, in this procedure, the heating plate 45 has already been heated by the power source (not illustrated) via the heater lead 46, so that the temperature of the heating plate 45 has been raised, for instance, to be 350° C. or more.

The reason for raising the temperature of the heating plate 45 to be 350° C. or more is because of the rise of the evaluation temperature, as the evaluation temperature of the currently-used copper wiring of the IC 1 in the state of electro-migration is 350° C., while the evaluation temperature of the aluminum wiring used in the past was 250° C. at the maximum. The electro-migration is a diffusion phenomenon owing to the interaction between metal atoms in the metal wiring and electrons passing through the wiring film.

Conventionally, when the IC 1 is heated by the heating plate 45, the heat of the IC 1 escapes into the IC socket 2 so that the temperature of IC 1 is hardly kept consistent.

In contrast, the present embodiment is arranged so that the protrusions 2b are formed on the IC socket 2 so that a gap is formed between the IC 1 and the IC socket 2. On this account, the thermal diffusion due to the conduction from the IC 1 to the IC socket 2 is prevented, and the temperature of the IC 1 is kept consistent.

Moreover, in the electric property evaluation of the internal wiring of the IC 1, owing to the miniaturization of the wiring of the IC 1, the measuring current is getting smaller so that units of fA (femtoampere=$10^{-15}$A) have currently been used for the measurement. To measure such a minute current, it is necessary to reduce the disturbance noise affecting the measuring system as much as possible. However, a high-insulating material conventionally used for the shielding arrangement for reducing the disturbance noise, such as Teflon, etc., is not usable at a high temperature of 350° C.

Figure 2:
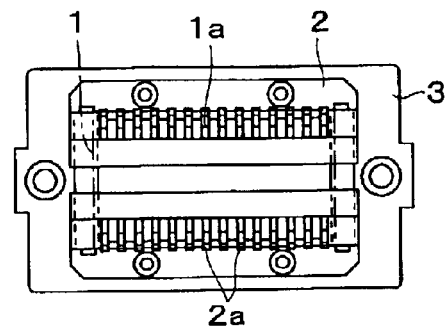
FIG. 2(a) is a plan view, illustrating the IC socket module to which an IC is attached.
FIG. 2(b) is a front view, illustrating the IC socket module to which an IC is attached.
Figure 2:
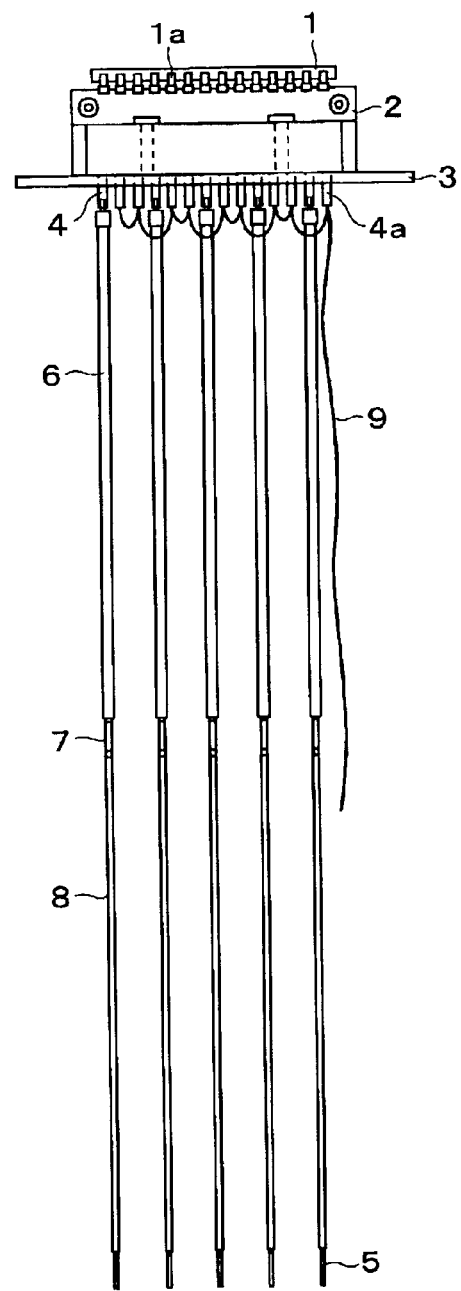

Thus, as illustrated in FIG. 2(*b*), the present embodiment is arranged such that, around the terminals 4 of the IC socket 2, each of the leads 5 made of nickel is covered with the insulating tube 6 made of glass. Therefore, the insulating tube 6 is not melted away even if the IC socket 2 has a high temperature.

As described above, since the measuring current is minute, it is necessary to reduce the disturbance noise affecting the measuring system as much as possible. Conventionally, Teflon-covered wires, which are made of a high-insulating material generally used for the shield arrangement of preventing the disturbance noise, are adopted so that the shielding is effectively carried out. However, in the present embodiment, a part of the each lead 5, the part being close to the terminals 4, is covered with the insulating tube 6 made of glass, so as not to be shielded. Thus, in the present embodiment, the copper tube 20 is utilized for shielding this part. On this account, the present embodiment has an effective shield arrangement which endures a high temperature well.

Furthermore, the present embodiment gives attention to the non-connecting terminals 4a with which the leads 5 are not connected, among the plurality of terminals 4 of the IC socket 2.

Figure 9:
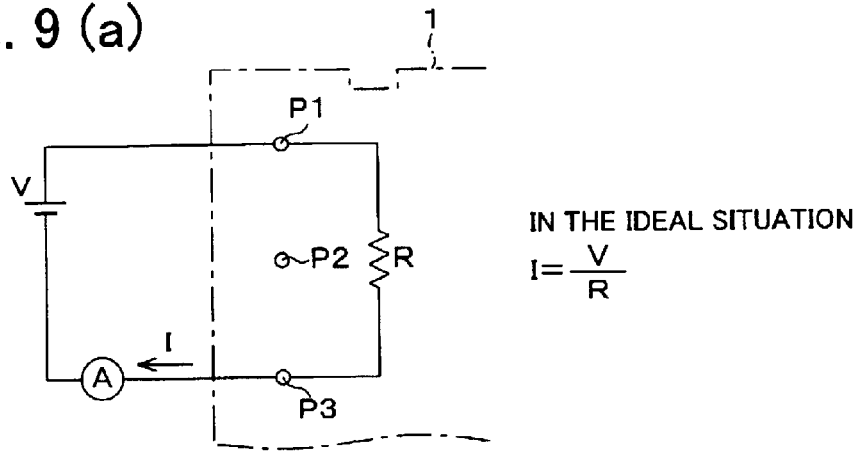
FIG. 9(a) is a circuit diagram, illustrating an IC leak current.
FIG. 9(b) is a circuit diagram, illustrating an IC leak current.
FIG. 9(c) is a circuit diagram, illustrating an IC leak current.
Figure 9:
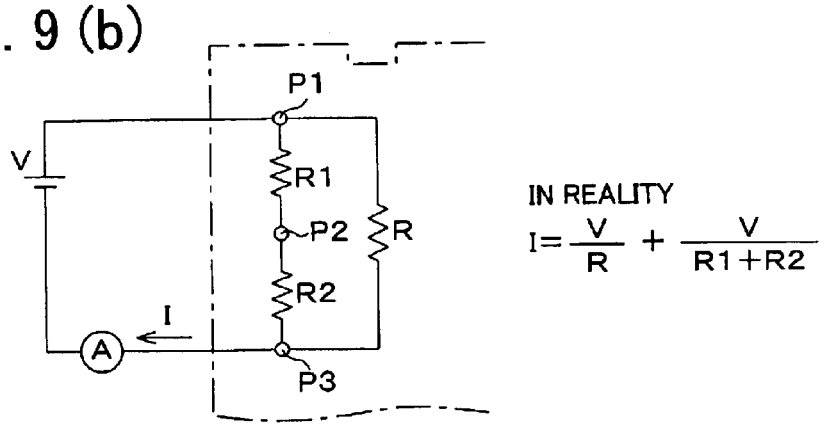
Figure 9:
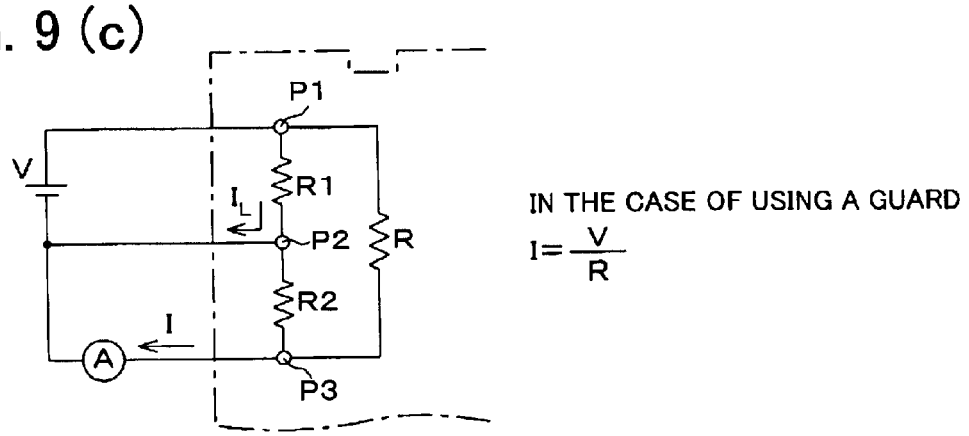
Figure 10:
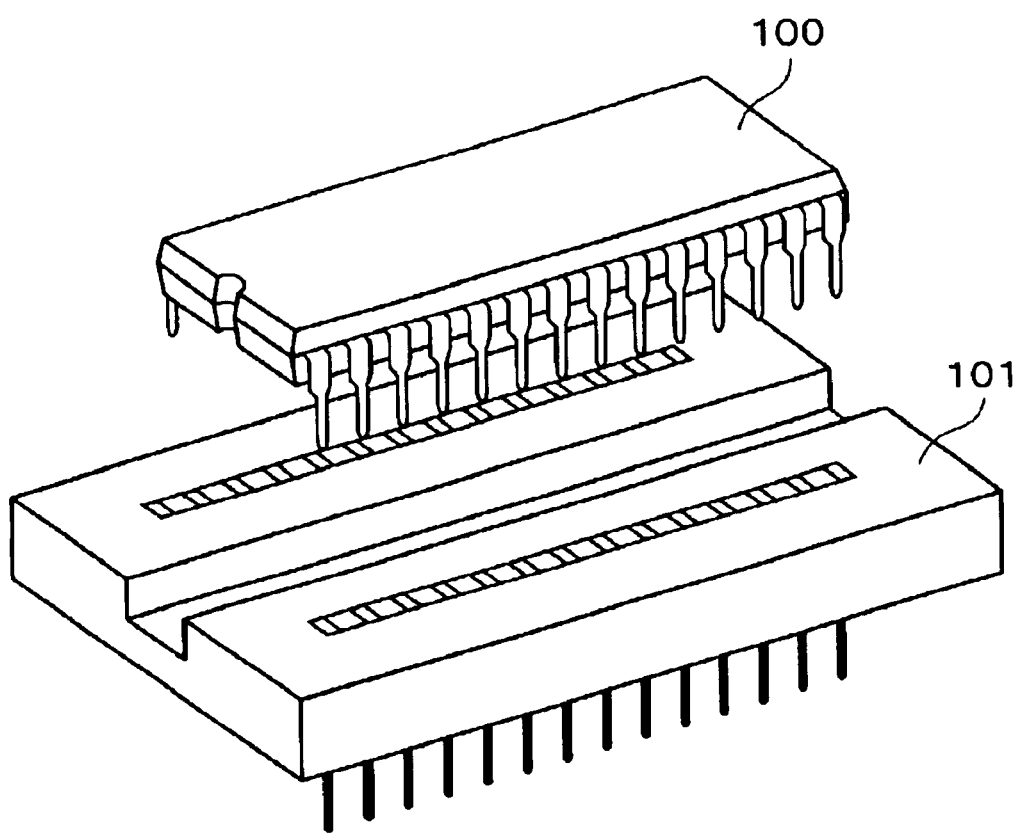
FIG. 10 is an oblique perspective view, illustrating an IC and an IC socket.
Figure 11:
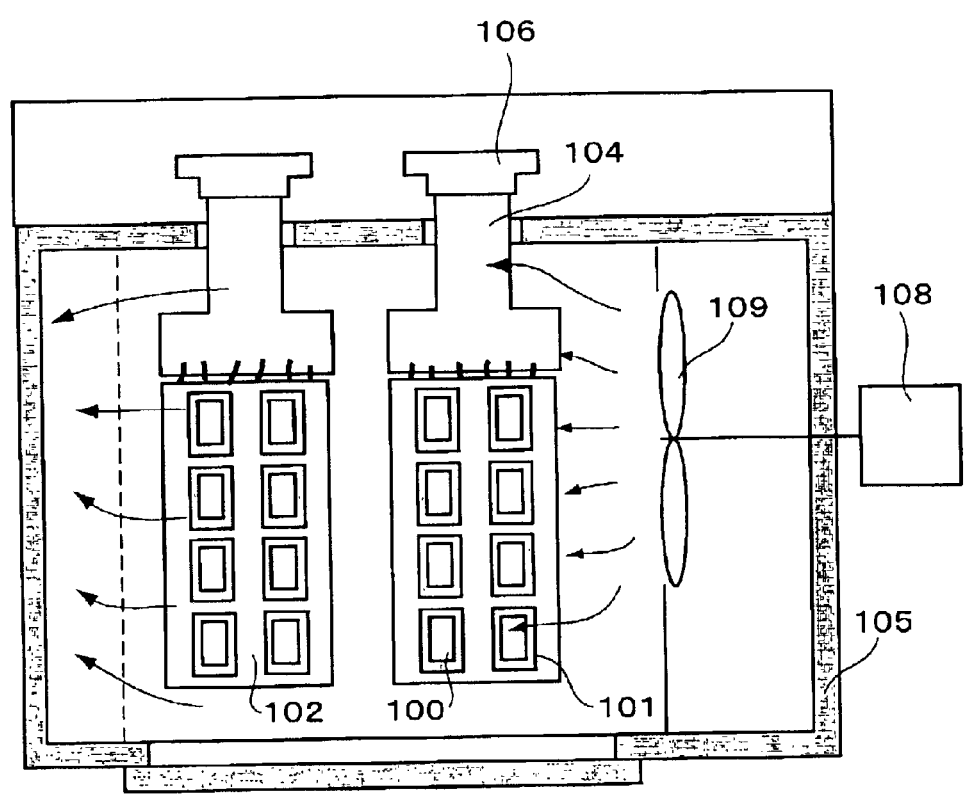
FIG. 11 is a plan view, illustrating a sample heating device of a conventional IC socket module.
Figure 12:
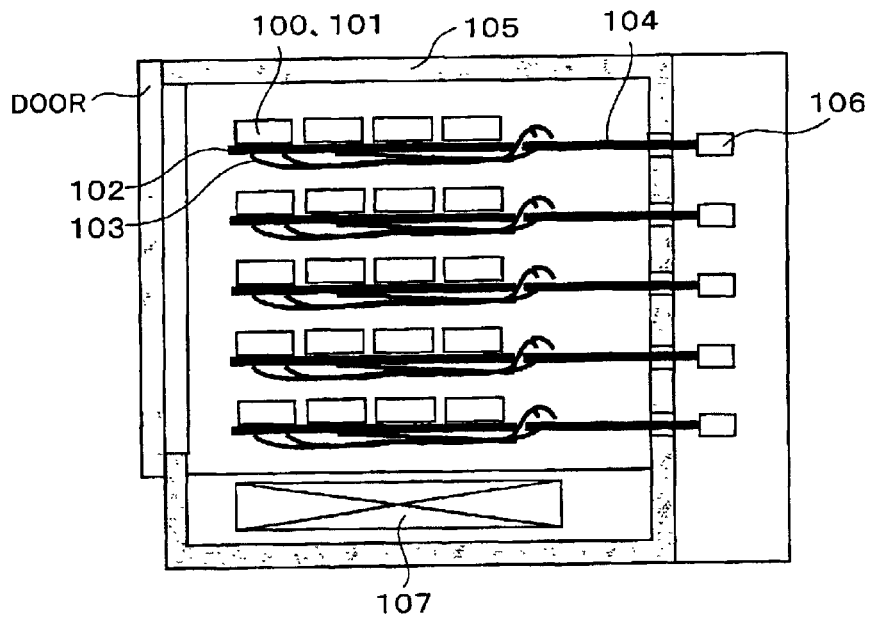
FIG. 12 is a side view, illustrating the sample heating device of the conventional IC socket module.
Figure 13:
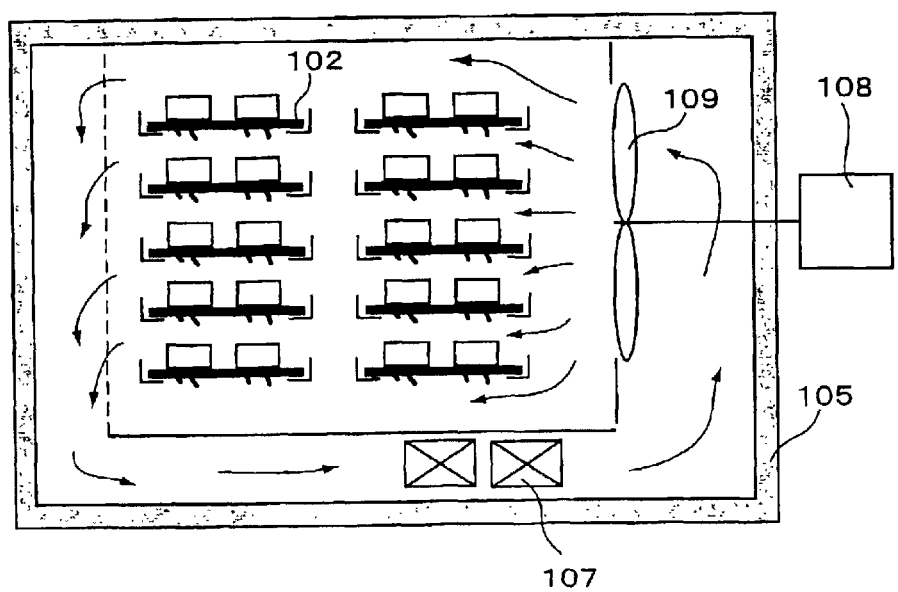
FIG. 13 is a front view, illustrating the sample heating device of the conventional IC socket module.
Figure 14:
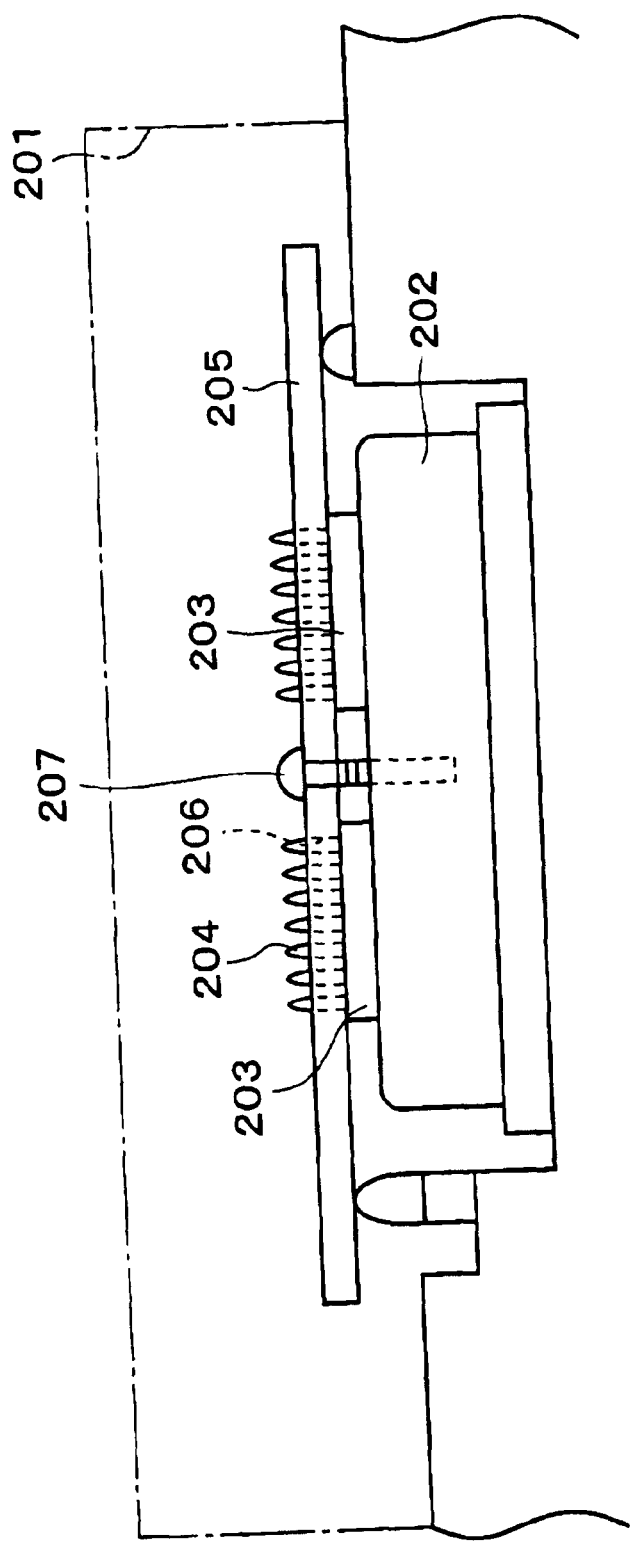
FIG. 14 is a structural view, illustrating another conventional sample heating device.

That is to say, as illustrated in FIG. 9(*a*), when the impedance R of a pin P1 and a pin P3 of the IC 1 is measured, in the ideal situation, when a voltage V is applied, a current I passing through this circuit is:
I=V/R
However, in reality, due to the existence of a pin P2 which does not contribute to the measurement, there are a resistance R1 between the pins P1 and P2 and a resistance R2 between the pins P3 and P2, as illustrated in FIG. 9(*b*). Taking these resistances R1 and R2 into account, the current I passing through the circuit is:
I=(V/R)+V/(R1+R2)
Thus it is impossible to measure the impedance R properly.

That is to say, the resistances R1 and R2, which are between the pin P2 which does not contribute to the measurement and the pin P1 and between the pin P2 and the pin P3 respectively, are not negligible, when measuring a minute electric current.

In view of this, as FIG. 9(*c*) illustrates, grounding the pin P2 makes it possible to totally eliminate the current running through the resistances R1 and R2 so that the impedance R can be measured properly.

In the present embodiment, as illustrated in FIG. 3, among the plurality of terminals 4 of the IC socket 2, the non-connecting terminals 4a with which the leads 5 are not connected are serially jumper-connected with the grounding wire 9, and one end of the grounding wire 9 is grounded. On this account, it is possible to prevent the mis-measurement due to the generation of a leak current.

Moreover, precise measurement of a minute electric current is preferably carried out by the 4-terminal-pair method, however, the state of shielding of the leads 5 plays an important role in doing so. In the present embodiment, the copper tubes 20 are electrically connected with the coaxial connectors 16 via the columns 19, and this makes it possible to carry out the precise measurement by the 4-terminal-pair-mehtod.

As described above, the IC socket module in accordance with the present embodiment is arranged so that the IC socket 2 is provided with the protrusions 2b for forming a gap between the IC socket 2 and the IC 1 and hence the IC 1 contacts the IC socket 2 only at the protrusions. On this account, when the IC 1 is heated by the heating plate 45, the thermal conduction from the IC 1 to the IC socket 2 is small.

Consequently, it is possible to provide the IC socket module in which the temperature of the IC 1 can be kept consistent when the internal wiring and wiring members of the IC 1 are evaluated at a high temperature.

Moreover, the IC socket module in accordance with the present embodiment is arranged so that the IC socket 2 is provided with the springs 11 for opposing the pressure exerted due to the movement of the heating plate 45 touching the IC 1. Thus, thanks to the elasticity of the springs 11, the heating plate 45 evenly contacts with the IC 1 so that these two members closely contact with each other, and hence it is possible to improve the thermal conductivity from the heating plate 45 to the IC 1.

Furthermore, the IC socket module in accordance with the present embodiment is arranged so that each of the leads 5 is coaxially covered with the thermal insulating tube made of, for instance, glass. On this account, even if the IC socket 2 has a high temperature, the coverings of the respective leads 5 are not affected so as not to be melted, etc.

Moreover, the IC socket module in accordance with the present embodiment is arranged so that the edge of the insulating tube 6 made of glass, the edge closer to the terminal 4, is formed so as to be funnel-shaped. On this account, it is possible to avoid the damage of the leads 5, which is caused when each of the leads 5 touches the end face of the corresponding insulating tube 6. Especially, since the IC socket 2 vibrates thanks to the springs 11, this arrangement greatly contributes to the reduction of the damage of the leads 5.

Incidentally, when the floating arrangement in which the IC socket 2 vibrates thanks to the springs 11 is adopted, the vibration of the IC socket 2 thanks to the springs 11 does not effectively occur due to the linearity of the leads 5, if a buffer mechanism is not provided between the IC socket 2 and the coaxial connectors 16. In short, the heating plate 45 cannot effectively press the IC 1.

Thus, in the present embodiment, the leads 5 are connected with the respective coaxial connectors 16 after forming the ring sections 5a on the respective leads 5. On this account, when the heating plate 45 presses the IC 1, the ring sections 5a buffer the movement.

Consequently, the heating plate 45 effectively presses the IC 1 and the damage of the leads 5 is prevented.

The IC socket module in accordance with the present embodiment is arranged so that the copper tubes 20 are coaxially provided outside the corresponding insulating tubes 6 covering the corresponding leads 5, and the copper tubes 20 are supported so as to be in isolation from the IC socket 2, in order to be thermally isolated from a high temperature.

Therefore, the copper tubes 20 can be utilized as the shield conductors. Also, since the copper tubes 20 are thermal conductors, the copper tubes 20 function as a heat sink of the IC socket 2 when the copper tubes 20 directly contact with the IC socket 2, so that the temperature of the IC 1 is influenced by the copper tubes 20 via the IC socket 2.

In this regard, the present embodiment is arranged so that the copper tubes 20 are supported so as to be in isolation from the IC socket 2, in order to thermally insulate the copper tubes 20 from a high temperature. On this account, the influence of the temperature on the IC socket 2 and the IC 1 is limited.

Moreover, the IC socket module in accordance with the present embodiment is arranged so that, among the plurality of terminals 4 of the IC socket 2, the non-connecting terminals 4a with which the leads 5 are not connected are grounded. Thus, either (i) a terminal 4 provided between the terminals 4 used for the measurement, among the terminals 4 of the IC socket 2 or (ii) a guard ring having the same function as the above-mentioned single terminal 4 is utilized as a guard signal for the measurement, so that the error of the measurement due to the leak current of the IC socket 2 itself can be eliminated.

The IC socket module in accordance with the present embodiment is arranged so that the copper tubes 20 are electrically connected with the coverings of the coaxial connectors 16 via the tube supporting plates 14 and 15, the columns 19, and the connector mounting plate 17.

Thus, it is possible to realize coaxial wires which can be used in a high-frequency 4-terminals measurement.

As described above, the IC socket module in accordance with the present invention further includes elastic members, which are provided to the IC socket, for opposing pressure exerted due to the heating member making contact with the IC.

Thus, thanks to the elasticity of the elastic members, the surface of the heating member evenly contacts with the surface of the IC, and this improvement of the degree of contact allows the improvement of the thermal conductivity from the heating member to the IC.

Moreover, the IC socket module in accordance with the present invention is arranged such that each of the leads is coaxially covered with a thermal insulating tube.

Thus, the insulating tubes covering the respective leads are not melted away even if the IC socket has a high temperature.

Moreover, the IC socket module in accordance with the present invention is arranged such that edges on a side of the terminals in the respective thermal insulating tubes are provided so as to have a funnel-shape.

On this account, it is possible to avoid the damage of the leads, which is caused when each of the lead touches the end face of the corresponding insulating tube. Especially, since the IC socket vibrates thanks to the elastic members, this arrangement greatly contributes to the reduction of the damage of the leads.

Incidentally, when the floating arrangement in which the IC socket vibrates thanks to the elastic members is adopted, the vibration of the IC socket thanks to the elastic members does not effectively occur due to the linearity of the leads, if a buffer mechanism is not provided between the IC socket and the coaxial connectors. In short, the heating plate cannot effectively press the IC.

Thus, in the IC socket module in accordance with the present invention, the leads are connected with the respective coaxial connectors after the ring sections are formed on the respective leads. On this account, when the heating plate presses the IC, the ring sections buffer the movement.

Consequently, the heating plate effectively presses the IC and the damage of the leads is prevented.

Moreover, the IC socket module in accordance with the present invention further includes metal tubes which are coaxially provided outside the respective thermal insulating tubes covering the respective leads, the metal tubes being supported in isolation from the IC socket so as to be thermally isolated from the high temperature.

On this account, the metal tubes can be utilized as shield conductors.

In the meantime, since the metal tubes are thermal conductors, the metal tubes function as a heat sink of the IC socket when the metal tubes directly contact with the IC socket, so that the temperature of the IC is influenced by the metal tubes via the IC socket.

In this regard, the present invention is arranged such that the metal tubes are supported so as to be isolated from the IC socket, in order to thermally insulate the metal tubes from a high temperature. On this account, the influence of the temperature on the IC socket and the IC is limited.

Moreover, the IC socket module in accordance with the present invention further includes terminals, with which the leads are not connected, attached to the IC socket, the terminals being grounded.

Thus, either (i) a terminal provided between the terminals used for the measurement, among the terminals of the IC socket or (ii) a guard ring having the same function as the above-mentioned terminal is utilized as a guard signal for the measurement, so that the error of the measurement due to the leak current of the IC socket itself can be eliminated.

Moreover, the IC socket module in accordance with the present invention further includes: at least one metal tube supporting member for supporting the metal tubes; a connector supporting member for supporting the coaxial connectors; and columns for combining the at least one metal tube supporting member with the connector supporting member, the metal tubes being electrically connected with coverings of the respective coaxial connectors, via the at least one metal tube supporting member, the columns, and the connector supporting member.

Thus, since the metal tubes are connected with the coverings of the respective coaxial connectors via the at least one metal tube supporting member, the columns, and the connector supporting member, it is possible to realize coaxial wires which can be used in the high-frequency 4-terminals measurement.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An IC socket module for carrying out electric property evaluation of internal wiring of an IC at a high temperature, comprising:

an IC socket to which the IC is attached;

protrusions which are provided on the IC socket and contact a back surface of the IC so as to support the IC in order to form a gap between the IC socket and the IC;

terminals which are attached to the IC socket;

leads which are connected with the respective terminals; and coaxial connectors which are connected with (i) the respective leads and (ii) external wiring, the IC attached to the IC socket being directly in touch with a heating member so as to make the IC have a high temperature.

2. The IC socket module as defined in claim 1, further comprising elastic members, which are provided to the IC socket, for opposing pressure exerted due to the heating member making contact with the IC.

3. The IC socket module as defined in claim 1, wherein each of the leads is coaxially covered with a thermal insulating tube.

4. The IC socket module as defined in claim 2, wherein each of the leads is coaxially covered with a thermal insulating tube.

5. The IC socket module as defined in claim 3, wherein edges on a side of the terminals in the respective thermal insulating tubes are provided so as to have a funnel-shape.

6. The IC socket module as defined in claim 4, wherein edges on a side of the terminals in the respective thermal insulating tubes are provided so as to have a funnel-shape.

7. The IC socket module as defined in claim 3, wherein each of the leads, on which a ring section is formed, is connected with the corresponding coaxial connector.

8. The IC socket module as defined in claim 4, wherein each of the leads, on which a ring section is formed, is connected with the corresponding coaxial connector.

9. An IC socket module for carrying out electric property evaluation of internal wiring of an IC at a high temperature, comprising:

an IC socket to which the IC is attached;

protrusions, which are provided on the IC socket, for forming a gap between the IC socket and the IC;

terminals which are attached to the IC socket;

leads which are connected with the respective terminals; and coaxial connectors which are connected with (i) the respective leads and (ii) external wiring, the IC attached to the IC socket being directly in touch with a heating member so as to make the IC have a high temperature;

wherein each of the leads is coaxially covered with a thermal insulating tube; and further comprising metal tubes which are coaxially provided outside the respective thermal insulating tubes covering the respective leads, the metal tubes being supported in isolation from the IC socket so as to be thermally isolated from the high temperature.

10. An IC socket module for carrying out electric property evaluation of internal wiring of an IC at a high temperature, comprising:

an IC socket to which the IC is attached;

protrusions, which are provided on the IC socket, for forming a gap between the IC socket and the IC;

terminals which are attached to the IC socket;

leads which are connected with the respective terminals; and coaxial connectors which are connected with (i) the respective leads and (ii) external wiring, the IC attached to the IC socket being directly in touch with a heating member so as to make the IC have a high temperature;

further comprising elastic members, which are provided to the IC socket, for opposing pressure exerted due to the heating member making contact with the IC;

wherein each of the leads is coaxially covered with a thermal insulating tube; and further comprising metal tubes which are coaxially provided outside the respective thermal insulating tubes covering the respective leads, the metal tubes being supported in isolation from the IC socket so as to be thermally isolated from the high temperature.

11. An IC socket module for carrying out electric property evaluation of internal wiring of an IC at a high temperature, comprising:

an IC socket to which the IC is attached;

protrusions, which are provided on the IC socket, for forming a gap between the IC socket and the IC;

terminals which are attached to the IC socket;

leads which are connected with the respective terminals; and coaxial connectors which are connected with (i) the respective leads and (ii) external wiring, the IC attached to the IC socket being directly in touch with a heating member so as to make the IC have a high temperature;

wherein each of the leads is coaxially covered with a thermal insulating tube;

wherein edges on the side of the terminals in the respective thermal insulating tubes are provided so as to have a funnel-shape; and further comprising metal tubes which are coaxially provided outside the respective thermal insulating tubes covering the respective leads, the metal tubes being supported in isolation from the IC socket so as to be thermally isolated from the high temperature.

12. An IC socket module for carrying out electric property evaluation of internal wiring of an IC at a high temperature, comprising:

an IC socket to which the IC is attached;
protrusions, which are provided on the IC socket, for forming a gap between the IC socket and the IC;
terminals which are attached to the IC socket;
leads which are connected with the respective terminals; and
coaxial connectors which are connected with (i) the respective leads and (ii) external wiring,
the IC attached to the IC socket being directly in touch with a heating member so as to make the IC have a high temperature;
further comprising elastic members, which are provided to the IC socket, for opposing pressure exerted due to the heating member making contact with the IC;
wherein each of the leads is coaxially covered with a thermal insulating tube;
wherein edges on a side of the terminals in the respective thermal insulating tubes are provided so as to have a funnel-shape; and
further comprising metal tubes which are coaxially provided outside the respective thermal insulating tubes covering the respective leads,
the metal tubes being supported in isolation from the IC socket so as to be thermally isolated from the high temperature.

13. An IC socket module for carrying out electric property evaluation of internal wiring of an IC at a high temperature, comprising:

an IC socket to which the IC is attached;
protrusions, which are provided on the IC socket, for forming a gap between the IC socket and the IC;
terminals which are attached to the IC socket;
leads which are connected with the respective terminals; and
coaxial connectors which are connected with (i) the respective leads and (ii) external wiring,
the IC attached to the IC socket being directly in touch with a heating member so as to make the IC have a high temperature;
wherein each of the leads is coaxially covered with a thermal insulating tube;
wherein each of the leads, on which a ring section is formed, is connected with the corresponding coaxial connector; and
further comprising metal tubes which are coaxially provided outside the respective thermal insulating tubes covering the respective leads,
the metal tubes being supported in isolation from the IC socket so as to be thermally isolated from the high temperature.

14. An IC socket module for carrying out electric property evaluation of internal wiring of an IC at a high temperature, comprising:

an IC socket to which the IC is attached;
protrusions, which are provided on the IC socket, for forming a gap between the IC socket and the IC;
terminals which are attached to the IC socket;
leads which are connected with the respective terminals; and
coaxial connectors which are connected with (i) the respective leads and (ii) external wiring,
the IC attached to the IC socket being directly in touch with a heating member so as to make the IC have a high temperature;
further comprising elastic members, which are provided to the IC socket, for opposing pressure exerted due to the heating member making contact with the IC;
wherein each of the leads is coaxially covered with a thermal insulating tube;
wherein each of the leads, on which a ring section is formed, is connected with the corresponding coaxial connector; and
further comprising metal tubes which are coaxially provided outside the respective thermal insulating tubes covering the respective leads,
the metal tubes being supported in isolation from the IC socket so as to be thermally isolated from the high temperature.

15. The IC socket module as defined in claim 1, further comprising terminals with which the leads are not connected, the terminals being attached to the IC socket and grounded.

16. The IC socket module as defined in claim 9, further comprising:
at least one metal tube supporting member for supporting the metal tubes;
a connector supporting member for supporting the coaxial connectors; and
columns for combining said at least one metal tube supporting member with the connector supporting member,
the metal tubes being electrically connected with coverings of the respective coaxial connectors, via said at least one metal tube supporting member, the columns, and the connector supporting member.

17. The IC socket module as defined in claim 10, further comprising:
at least one metal tube supporting member for supporting the metal tubes;
a connector supporting member for supporting the coaxial connectors; and
columns for combining said at least one metal tube supporting member with the connector supporting member,
the metal tubes being electrically connected with coverings of the respective coaxial connectors, via said at least one metal tube supporting member, the columns, and the connector supporting member.

18. The IC socket module as defined in claim 11, further comprising:
at least one metal tube supporting member for supporting the metal tubes;
a connector supporting member for supporting the coaxial connectors; and
columns for combining said at least one metal tube supporting member with the connector supporting member,
the metal tubes being electrically connected with coverings of the respective coaxial connectors, via said at least one metal tube supporting member, the columns, and the connector supporting member.

19. The IC socket module as defined in claim 12, further comprising:
at least one metal tube supporting member for supporting the metal tubes;

a connector supporting member for supporting the coaxial connectors; and columns for combining said at least one metal tube supporting member with the connector supporting member, the metal tubes being electrically connected with coverings of the respective coaxial connectors, via said at least one metal tube supporting member, the columns, and the connector supporting member.

20. The IC socket module as defined in claim 13, further comprising:

at least one metal tube supporting member for supporting the metal tubes;

a connector supporting member for supporting the coaxial connectors; and columns for combining said at least one metal tube supporting member with the connector supporting member, the metal tubes being electrically connected with coverings of the respective coaxial connectors, via said at least one metal tube supporting member, the columns, and the connector supporting member.

21. The IC socket module as defined in claim 14, further comprising:

at least one metal tube supporting member for supporting the metal tubes;

a connector supporting member for supporting the coaxial connectors; and columns for combining said at least one metal tube supporting member with the connector supporting member, the metal tubes being electrically connected with coverings of the respective coaxial connectors, via said at least one metal tube supporting member, the columns, and the connector supporting member.

22. The IC socket module as defined in claim 1, further comprising elastic members, which are provided to the IC socket, for opposing pressure exerted due to the heating member making contact with the IC, the IC socket and the IC being provided between the elastic members and the heating member.

23. The IC socket module as defined in claim 9, wherein edges on a side of the terminals in the respective thermal insulating tubes are provided so as to have a funnel-shape.

24. The IC socket module as defined in claim 10, wherein edges on a side of the terminals in the respective thermal insulating tubes are provided so as to have a funnel-shape.

25. The IC socket module as defined in claim 9, wherein each of the leads, on which a ring section is formed, is connected with the corresponding coaxial connector.

26. The IC socket module as defined in claim 10, wherein each of the leads, on which a ring section is formed, is connected with the corresponding coaxial connector.

* * * * *